(12) United States Patent
Tsuno et al.

(10) Patent No.: US 8,853,556 B2
(45) Date of Patent: Oct. 7, 2014

(54) TRANSPARENT CONDUCTIVE FILM (71) Applicant: Nitto Denko Corporation, Ibaraki (JP)

(72) Inventors: Naoki Tsuno, Osaka (JP); Hiroyuki Takao, Osaka (JP); Katsunori Takada, Osaka (JP); Kazuhiro Ikai, Ibaraki (JP)

(73) Assignee: Nitto Denko Corporation, Ibaraki-shi (JP)

( * ) Notice: Subject to any disclaimer, the term of this patent is extended or adjusted under 35 U.S.C. 154(b) by 0 days.

(21) Appl. No.: 14/046,036

(22) Filed: Oct. 4, 2013

(65) Prior Publication Data

US 2014/0030484 A1    Jan. 30, 2014

Related U.S. Application Data (62) Division of application No. 13/683,226, filed on Nov. 21, 2012, now Pat. No. 8,563,870.

(30) Foreign Application Priority Data

Nov. 24, 2011   (JP) .................................. 2011-255764

(51) Int. Cl.
*H05K 1/03* (2006.01)
*G06F 3/041* (2006.01)
*H05K 1/02* (2006.01)
*H05K 1/11* (2006.01)

(52) U.S. Cl.
CPC .............. *H05K 1/0313* (2013.01); *G06F 3/041* (2013.01); *H05K 1/119* (2013.01); *H05K 2201/0108* (2013.01); *H05K 1/0274* (2013.01)
USPC ............................ 174/255; 174/250; 174/256

(58) Field of Classification Search
CPC ......... H05K 1/00; H05K 1/0274; H05K 1/03; G02B 1/11
USPC ............ 174/250, 255, 256; 428/412; 359/601
See application file for complete search history.

(56) References Cited

U.S. PATENT DOCUMENTS

| 5,096,796 A | 3/1992 | Mammino et al. |
| 6,987,354 B2 | 1/2006 | Arakawa et al. |
| 7,390,099 B2 | 6/2008 | Takao et al. |
| 7,901,746 B2 | 3/2011 | Noguchi et al. |
| 7,963,660 B2 | 6/2011 | Hamamoto et al. |
| 8,124,215 B2 | 2/2012 | Takao et al. |

(Continued)

FOREIGN PATENT DOCUMENTS

| JP | 2004-258308 A | 9/2004 |
| JP | 2004258308 A * | 9/2004 |

(Continued)

*Primary Examiner* — Hoa C Nguyen
*Assistant Examiner* — Amol Patel
(74) *Attorney, Agent, or Firm* — Westerman, Hattori, Daniels & Adrian, LLP (57) ABSTRACT A transparent conductive film which comprises: a substrate composed of a non-crystalline polymer film; a first hard coating layer; a first transparent conductor layer; a first metal layer; a second hard coating layer; a second transparent conductor layer; and a second metal layer. The first hard coating layer includes a binder resin and a plurality of sphere-shaped particles having a diameter of 1 μm to 5 μm. The first metal layer has a plurality of projections having a maximum height Rz of 0.5 μm to 2.5 μm resulting from the plurality of particles included in the first hard coating layer on a surface thereof.

15 Claims, 3 Drawing Sheets

(56) References Cited

U.S. PATENT DOCUMENTS

| | | | |
|---|---|---|---|
| 2001/0050741 A1* | 12/2001 | Hokazono et al. | 349/137 |
| 2004/0246238 A1* | 12/2004 | Oya et al. | 345/173 |
| 2006/0072197 A1 | 4/2006 | Iwata et al. | |
| 2007/0291367 A1 | 12/2007 | Hamamoto et al. | |
| 2009/0284475 A1* | 11/2009 | Nashiki et al. | 345/173 |
| 2011/0102385 A1 | 5/2011 | Jung et al. | |
| 2012/0073947 A1 | 3/2012 | Sakata et al. | |
| 2012/0118617 A1 | 5/2012 | Bories-Azeau et al. | |
| 2012/0237729 A1 | 9/2012 | Ozawa et al. | |

FOREIGN PATENT DOCUMENTS

| | | |
|---|---|---|
| JP | 2006-145736 A | 6/2006 |
| JP | 2007-144926 A | 6/2007 |
| JP | 2007-194109 A | 8/2007 |
| JP | 2010-079098 A | 4/2010 |
| JP | 2011-039978 A | 2/2011 |
| JP | 2011-60146 A | 3/2011 |

* cited by examiner

TRANSPARENT CONDUCTIVE FILM

CROSS-REFERENCE OF RELATED APPLICATION

This application is a Divisional Application No. 13/683,226, filed on Nov. 21, 2012, which claims priority of Japanese Patent Application No. 2011-255764, the entire contents of which are incorporated herein by reference.

BACKGROUND OF THE INVENTION

1. Field of the Invention

The present invention relates to a transparent conductive film used, for example, in a capacitance-type touch panel.

2. Description of Related Art

A conventional transparent conductive film comprises: a substrate; transparent conductor layers formed on both surfaces of the substrate; and a metal layer formed on each transparent conductor layer (for example, JP-A-2011-60146). When a conventional transparent conductive film is used for a capacitance-type touch panel, metallic wiring is formed outside a touch input region by processing a metal layer. This enables a frame portion of the capacitance-type touch panel narrower. A substrate composed of a polyethylene terephthalate film (crystalline polymer film) is used for the conventional transparent conductive film. The polyethylene terephthalate film (crystalline polymer film) has a great birefringence and the birefringence differs according to the place. As a result, the conventional transparent conductive film has color irregularity (shading of color). The polyethylene terephthalate film generally has a birefringence of 0.01 or so.

A non-crystalline polymer film has a smaller birefringence and is uniform compared with the crystalline polymer film. Accordingly, color irregularity of the transparent conductive film is resolved by the use of a substrate composed of a non-crystalline polymer film. The non-crystalline polymer film is however, weaker than a crystalline polymer film, resulting in fragile surfaces of the non-crystalline polymer film. Further, when both surfaces of the transparent conductive film have a metal layer and the transparent conductive film is rolled up to make a roll, there is a problem that adjacent metal layers of the transparent conductive film are bonded to each other by pressure. Pressure bonding is to fix by pressure and it also refers to as "blocking."

SUMMARY OF THE INVENTION

When a substrate composed of a non-crystalline polymer film is used, it is an object of the present invention to solve a problem that the substrate tends to scar easily. It is another object of the present invention to solve a problem of blocking of adjacent metal layers in the transparent conductive film The summary of the present invention is described as below.

In a first preferred aspect, a transparent conductive film according to the present invention comprises: a substrate composed of a non-crystalline polymer film; a first hard coating layer; a first transparent conductor layer; and a first metal layer. The first hard coating layer, the first transparent conductor layer, and the first metal layer are sequentially formed on one surface of the substrate. The transparent conductive film according to the present invention further comprises: a second hard coating layer; a second transparent conductor layer; and a second metal layer, which are sequentially formed on the other surface of the substrate. The first hard coating layer includes a binder resin and a plurality of sphere-shaped particles having a diameter of 1 μm to 5 μm. A diameter of each of the plurality of particles is greater than a thickness of a flat region in the binder resin. The first metal layer has a plurality of projections having a maximum height Rz of 0.5 μm to 2.5 μm resulting from the plurality of particles included in the first hard coating layer.

In a second preferred aspect of the transparent conductive film according to the present invention, the first metal layer has a distribution density of 100 pieces/mm$^2$ to 2,000 pieces/mm$^2$ in the plurality of projections formed on a surface thereof.

In a third preferred aspect of the transparent conductive film according to the present invention, the second hard coating layer includes a binder resin and a plurality of particles. A diameter and a thickness of a plurality of particles included in the second hard coating layer are respectively greater than the thickness of a flat region in the binder resin included in the second hard coating layer. The second metal layer has a plurality of projections resulting from the plurality of particles included in the second hard coating layer.

In a fourth preferred aspect of the transparent conductive film according to the present invention, the second metal layer has a distribution density of 100 pieces/mm$^2$ to 2,000 pieces/mm$^2$ in a plurality of projections formed on a surface thereof.

In a fifth preferred aspect of the transparent conductive film according to the present invention, a material for forming the non-crystalline polymer film is polycycloolefin or polycarbonate.

In a sixth preferred aspect of the transparent conductive film according to the present invention, the non-crystalline polymer film has an in-plane birefringence of 0 to 0.001 and the in-plane birefringence has irregularity of 0.0005 or lower.

In a seventh preferred aspect of the transparent conductive film according to the present invention, a material for forming the plurality of particles included in the first hard coating layer is acrylic polymer, silicone polymer, styrene polymer or inorganic silica.

In an eighth preferred aspect of the transparent conductive film according to the present invention, a material for forming the plurality of particles included in the second hard coating layer is acrylic polymer, silicone polymer, styrene polymer or inorganic silica.

In a ninth preferred aspect of the transparent conductive film according to the present invention, the plurality of particles included in the second hard coating layer are sphere-shaped and respectively have a diameter of 1 μm to 5 μm.

In a tenth preferred aspect of the transparent conductive film according to the present invention, the first hard coating layer has a content of the plurality of particles of 0.05% by weight to 3% by weight of the first hard coating layer.

In an eleventh preferred aspect of the transparent conductive film according to the present invention, the second hard coating layer has a content of the plurality of particles of 0.05% by weight to 3% by weight of the second hard coating layer.

In a twelfth preferred aspect of the transparent conductive film according to the present invention, the first metal layer has an arithmetic mean roughness Ra of 0.005 μm to 0.05 μm on a surface thereof.

In a thirteenth preferred aspect of the transparent conductive film according to the present invention, the second metal layer has an arithmetic mean roughness Ra of 0.005 μm to 0.05 μm on a surface thereof and has a maximum height Rz of 0.5 μm to 2.5 μm.

In a fourteenth preferred aspect of the transparent conductive film according to the present invention, each material for forming the first transparent conductor layer and the second transparent conductor layer is any one of indium tin oxide (ITO), indium zinc oxide or indium oxide-zinc composite oxide.

In a fifteenth preferred aspect of the transparent conductive film according to the present invention, each material for forming the first metal layer and the second metal layer is copper or silver.

Advantages of the Invention

According to the present invention, it is possible to solve problems of color irregularity, scratches of a surface, and blocking of metal layers.

DESCRIPTION OF THE PREFERRED EMBODIMENTS

The preferred embodiments of the present invention will now be described with reference to FIGS. 1 to 3. Identical elements in the figure are designated with the same reference numerals.

[Transparent Conductive Film]

Figure 1:
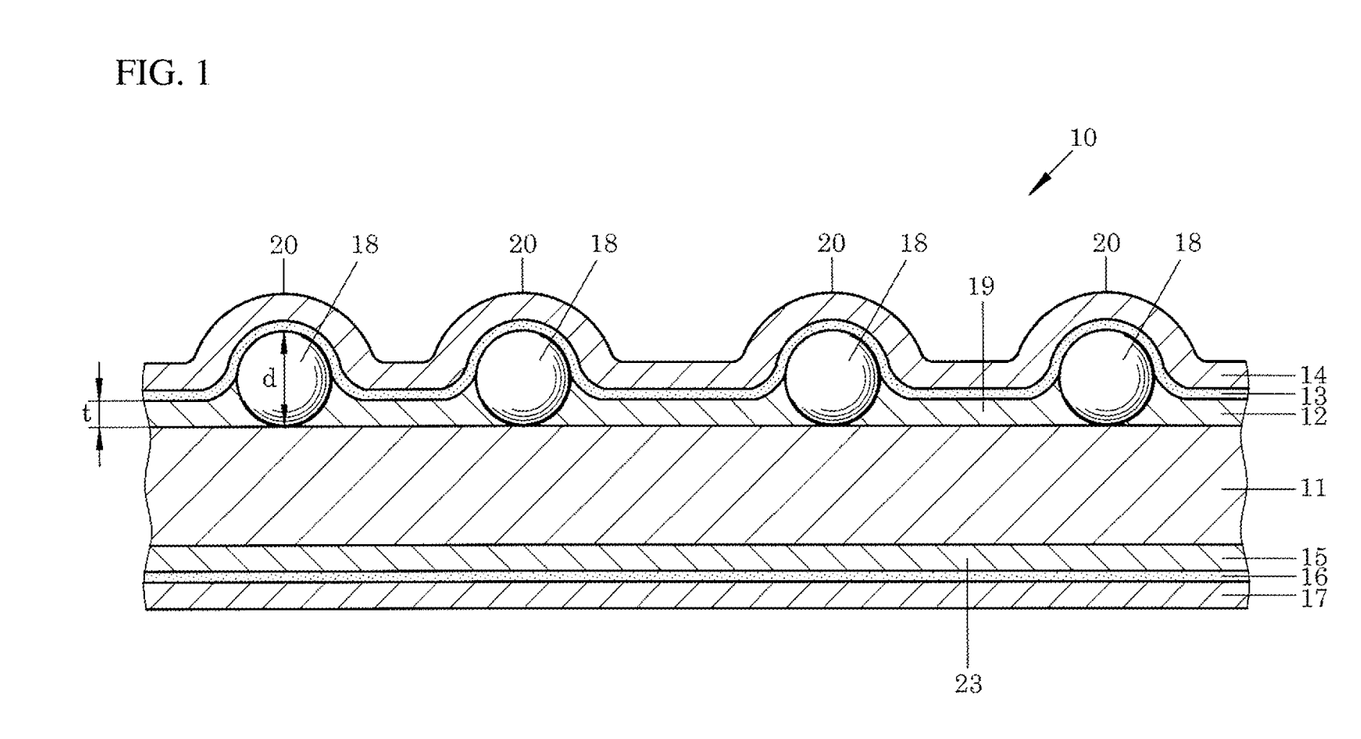
FIG. 1 is a cross-sectional schematic view of a transparent conductive film (first embodiment) of the present invention.

As shown in FIG. 1, a transparent conductive film 10 (first embodiment) of the present invention comprises: a substrate 11; a first hard coating layer 12; a first transparent conductor layer 13; and a first metal layer 14. The first hard coating layer 12, the first transparent conductor layer 13, and the first metal layer 14 are laminated on one surface of the substrate 11 (the top surface in FIG. 1) in this order. The transparent conductive film 10 of the present invention further comprises: a second hard coating layer 15; a second transparent conductor layer 16; and a second metal layer 17. The second hard coating layer 15, the second transparent conductor layer 16, and the second metal layer 17 are laminated on the other surface of the substrate 11 (the bottom surface in FIG. 1) in this order.

The substrate 11 is composed of a non-crystalline polymer film. The first hard coating layer 12 includes a binder resin 19 and a plurality of particles 18. Each diameter d of the plurality of particles 18 is greater than a thickness t of a flat region (a region without particles 18) of the binder resin 19. Accordingly, the height of a surface of the first hard coating layer 12 is high in a region with particles 18 and is low in a flat region with the binder resin 19 only. The first transparent conductor layer 13 and the first metal layer 14 are laminated along a surface of the first hard coating layer 12. The surface shape of the first metal layer 14, therefore, reflects the surface shape of the first hard coating layer 12 and has a projection 20 in each position having a particle 18.

The second hard coating layer 15 includes a binder resin 23. The surface shape of the second hard coating layer 15 is different from that of the first hard coating layer 12 and is flat. The second transparent conductor layer 16 and the second metal layer 17 are laminated along a surface of the second hard coating layer 15. The surface shape of the second metal layer 17, therefore, reflects the surface shape of the second hard coating layer 15 and is flat.

A non-crystalline polymer film having a small birefringence, which is uniform, is used for the substrate 11 of the transparent conductive film 10 of the present invention. Color irregularity in the transparent conductive film 10 of the present invention is removed. Further, in the transparent conductive film 10 of the present invention, respective surfaces of the substrate 11 are prevented from being scratched because the first hard coating layer 12 and the second hard coating layer 15 are covered with the respective surfaces of the substrate 11. Furthermore, the first metal layer 14 has a plurality of projections 20 on a surface thereof, so that the first metal layer 14 comes in point contact with the second metal layer 17 when the transparent conductive film 10 is rolled up to be a roll. This makes it possible to prevent blocking of the first metal layer 14 and the second metal layer 17.

It is possible to manufacture the elongated transparent conductive film 10 of the present invention by a Roll-to-Roll process because the transparent conductive film 10 is capable of avoiding scratches and blocking. Further, it is possible for the elongated transparent conductive film 10 to be stored, carried, and processed in the shape of a transparent conductive film roll. Accordingly, the transparent conductive film 10 of the present invention has high productivity.

Figure 2:
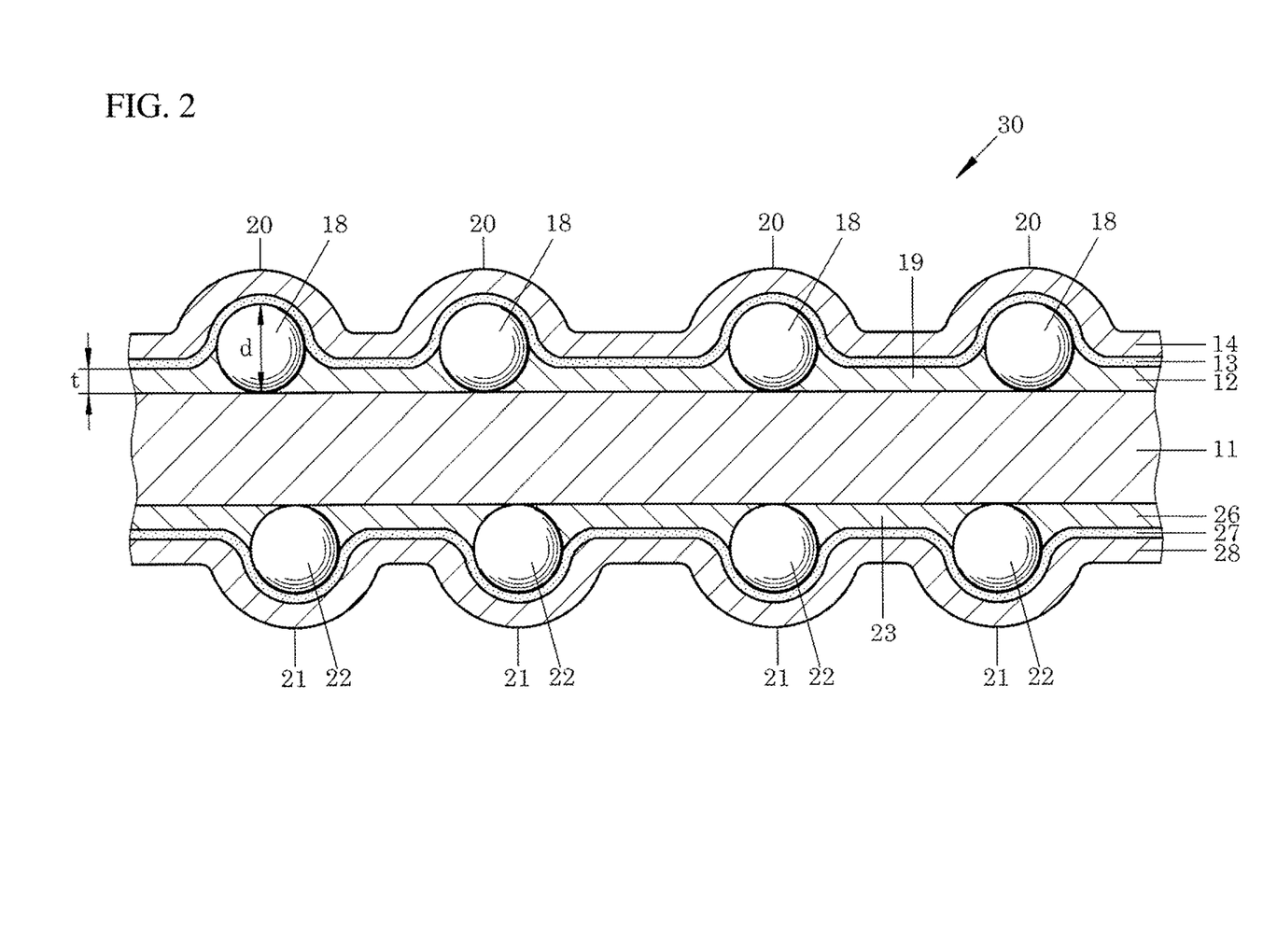
FIG. 2 is a cross-sectional schematic view of a transparent conductive film (second embodiment) of the present invention.

As shown in FIG. 2, a transparent conductive film 30 (second embodiment) comprises: a substrate 11; a first hard coating layer 12; a first transparent conductor layer 13; and a first metal layer 14. The first hard coating layer 12, the first transparent conductor layer 13, and the first metal layer 14 are laminated on one surface of the substrate 11 in this order. The transparent conductive film 30 of the present invention further comprises: a second hard coating layer 26; a second transparent conductor layer 27; and a second metal layer 28. The second hard coating layer 26, the second transparent conductor layer 27, and the second metal layer 28 are laminated on the other surface of the substrate 11 in this order.

The substrate 11 is composed of a non-crystalline polymer film The first hard coating layer 12 includes a binder resin 19 and a plurality of particles 18. Each diameter d of the plurality of particles 18 is greater than a thickness t of a flat region (a region without particles 18) in the binder resin 19. Accordingly, the height of a surface of the first hard coating layer 12 is high in a region with particles 18 and is low in a flat region with the binder resin 19 only. The first transparent conductor layer 13 and the first metal layer 14 are laminated along a surface of the first hard coating layer 12. The surface shape of the first metal layer 14, therefore, reflects the surface shape of the first hard coating layer 12 and has a projection 20 in each position having a particle 18.

The second hard coating layer 26 includes a binder resin 23 and a plurality of particles 22. Each diameter of the plurality of particles 22 is greater than a thickness of a flat region (a region without particles 22) of the binder resin 23. The surface shape of the second hard coating layer 26 is similar to that of the first hard coating layer 12 and the height of a surface of the second hard coating layer 26 is high in a region with particles 22 and is low in a flat region with the binder resin 23 only. Accordingly, the second transparent conductor layer 27 and the second metal layer 28 are laminated along a surface of the second hard coating layer 26. The surface shape of the second metal layer 28, therefore, reflects the surface shape of the second hard coating layer 26 and has a projection 21 in each position having a particle 22.

A non-crystalline polymer film having a small birefringence, which is uniform, is used for the substrate 11 of the transparent conductive film 30 of the present invention. Color irregularity in the transparent conductive film 30 of the present invention is removed. Further, in the transparent conductive film 30 of the present invention, respective surfaces of the substrate 11 are prevented from being scratched because the first hard coating layer 12 and the respective surfaces of the substrate 11 are covered with the first hard coating layer 12 and the second hard coating layer 26. Furthermore, the first metal layer 14 has a plurality of projections 20 on a surface thereof and the second metal layer 28 has a plurality of projections 21 on a surface thereof, so that the first metal layer 14 comes in point contact with the second metal layer 28 when the transparent conductive film 30 is rolled up to be a roll. This makes it possible to prevent blocking of the first metal layer 14 and the second metal layer 28. The transparent conductive film 30 in the second embodiment has higher prevention effects for blocking than the transparent conductive film 10 in the first embodiment.

It is possible to manufacture the elongated transparent conductive film 30 of the present invention by a Roll-to-Roll process because the transparent conductive film 30 invention is capable of avoiding scratches and blocking. Further, it is possible for the elongated transparent conductive film 30 to be stored, carried, and processed in the shape of a transparent conductive film roll. Accordingly, the transparent conductive film 30 of the present invention has high productivity.

Figure 3:
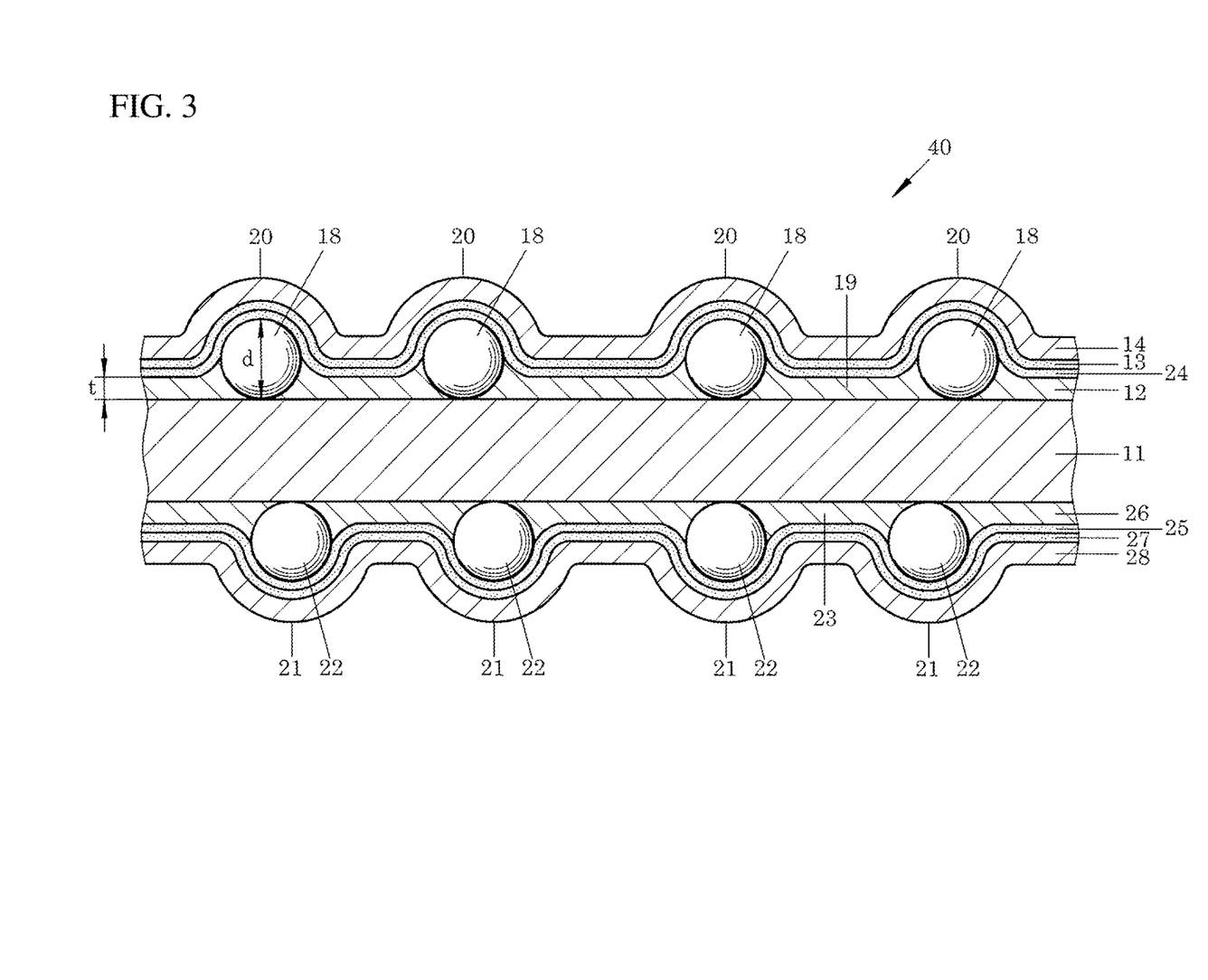
FIG. 3 is a cross-sectional schematic view of a transparent conductive film (third embodiment) of the present invention.

As shown in FIG. 3, a transparent conductive film 40 (third embodiment) comprises: a substrate 11; a first hard coating layer 12; a first index matching layer 24; a first transparent conductor layer 13; and a first metal layer 14. The first hard coating layer 12, the first index matching layer 24, the first transparent conductor layer 13, and the first metal layer 14 are laminated on one surface of the substrate 11 in this order. The transparent conductive film 40 of the present invention further comprises: a second hard coating layer 26; a second index matching layer 25; a second transparent conductor layer 27; and a second metal layer 28. The second hard coating layer 26, the second index matching layer 25, the second transparent conductor layer 27, and the second metal layer 28 are laminated on the other surface of the substrate 11 in this order.

The substrate 11 is composed of a non-crystalline polymer film. The first hard coating layer 12 includes a binder resin 19 and a plurality of particles 18. Each diameter d of the plurality of particles 18 is greater than a thickness t of a flat region (a region without particles 18) in the binder resin 19. Accordingly, the height of a surface of the first hard coating layer 12 is high in a region with particles 18 and is low in a flat region with the binder resin 19 only. The first index matching layer 24, the first transparent conductor layer 13, and the first metal layer 14 are laminated along a surface of the first hard coating layer 12. The surface shape of the first metal layer 14, therefore, reflects the surface shape of the first hard coating layer 12 and has a projection 20 in each position having a particle 18.

The second hard coating layer 26 includes a binder resin 23 and a plurality of particles 22. Each diameter of the plurality of particles 22 is greater than a thickness of a flat region (a region without particles 22) in the binder resin 23. The surface shape of the second hard coating layer 26 is similar to that of the first hard coating layer 12 and the height of a surface of the second hard coating layer 26 is high in a region with particles 22 and is low in a flat region with the binder resin 23 only. Accordingly, the second index matching layer 25, the second transparent conductor layer 27, and the second metal layer 28 are laminated along a surface of the second hard coating layer 26. The surface shape of the second metal layer 28, therefore, reflects the surface shape of the second hard coating layer 26 and has a projection 21 in each position having a particle 22.

A non-crystalline polymer film having a small birefringence, which is uniform, is used for the substrate 11 of the transparent conductive film 40 of the present invention. Color irregularity in the transparent conductive film 40 of the present invention is removed. Further, in the transparent conductive film 40 of the present invention, respective surfaces of the substrate 11 are prevented from being scratched because the respective surfaces of the substrate 11 are covered with the first hard coating layer 12 and the second hard coating layer 26. Furthermore, the first metal layer 14 has a plurality of projections 20 on a surface thereof and the second metal layer 28 has a plurality of projections 21 on a surface thereof, so that the first metal layer 14 comes in point contact with the second metal layer 28 when the transparent conductive film 40 is rolled up to be a roll. This makes it possible to prevent blocking of the first metal layer 14 and the second metal layer 28.

It is possible to manufacture the elongated transparent conductive film 40 of the present invention by a Roll-to-Roll process because the transparent conductive film 40 is capable of avoiding scratches and blocking. Further, it is possible for the elongated transparent conductive film 40 to be stored, carried, and processed in the shape of a transparent conductive film roll. Accordingly, the transparent conductive film 40 of the present invention has high productivity.

[Substrate]

The substrate 11 is composed of a non-crystalline polymer film. Since the non-crystalline polymer film has a smaller birefringence than a crystalline polymer film and is uniform, in the transparent conductive film of the present invention, color irregularity is removed. The non-crystalline polymer film to be used in the present invention preferably has an in-plane birefringence of 0 to 0.001 and more preferably 0 to 0.0005. The non-crystalline polymer film to be used in the present invention preferably has an in-plane birefringence irregularity of 0.0005 or lower, more preferably 0.0003 or lower. It is possible to achieve the aforementioned birefringence and birefringence irregularity by selecting a suitable kind of non-crystalline polymer film A material for forming the non-crystalline polymer film is not particularly limited, but is preferably polycycloolefin or polycarbonate. The substrate 11 composed of a non-crystalline polymer film typically has a thickness of 20 μm to 200 μm. The non-crystalline polymer film may typically have a thin easily adhering layer (not shown) made of poly urethane on a surface thereof.

[Hard Coating Layer]

The first hard coating layer 12 is formed on one surface of the substrate 11 and the second hard coating layers 15, 26 are respectively formed on the other surface of the substrate 11. The first hard coating layer 12 includes the binder resin 19 and a plurality of particles 18. The plurality of particles 18 randomly distribute in the binder resin 19. The second hard coating layer 15 includes the binder resin 23. The second hard coating layer 26 includes the binder resin 23 and the plurality of particles 22.

The plurality of particles 18 included in the first hard coating layer 12 are typically made of acrylic polymer, silicone polymer, styrene polymer or inorganic silica. The particles 18 are typically sphere-shaped. In the case where the particles 18 are sphere-shaped, the diameter d thereof is preferably 1 μm to 5 μm, more preferably 1.5 μm to 3.5 μm. In the case where the particles 18 are not sphere-shaped (for example, in the case of irregular amorphous infinite form), each particle 18 preferably has a height (the size of a direction to perpendicular to the surface of the substrate 11) of 1 μm to 5 μm, more preferably 1.5 μm to 3.5 μm. In the case where the particles 18 are sphere-shaped, the preferable diameter d thereof is preferably a most preferred particle size (a particle size indicating a maximum value of particle diameter distribution). In the case where the particles 18 are not sphere-shaped (for example, in the case of irregular amorphous infinite form), the preferable height of each particle 18 is preferably a most preferred particle size (a particle size indicating a maximum value of particle diameter distribution). The content of the particles 18 in the first hard coating layer 12 is suitably 0.05% by weight to 3% by weight of the weight of the first hard coating layer 12 from the view point of prevention of blocking.

The binder resin 19 of the first hard coating layer 12 typically includes a curing resin composition by ultraviolet rays and electron beams. The curing resin composition preferably contains a polymer in which acrylic acid is additionally reacted with glycidyl acrylate-based polymer. Alternatively, the curing resin composition preferably contains multifunctional acrylate polymer (pentaerythritol or dipentaerythritol or the like). The curing resin composition further contains a polymer initiator. The region of the binder resin 19 only (the region without particles 18) in the first hard coating layer 12 preferably has a thickness t of 0.5 µm to 3 µm, more preferably 0.8 µm to 3 µm. The binder resin 23 of the second hard coating layer 15 is just the same as the binder resin 19. Moreover, the binder resin 23 and the particles 22 of the second hard coating layer 26 are just the same as the above.

When the particles 18 are sphere-shaped, the diameter d of each particle 18 is greater than the thickness t of the region with the binder 19 only, so that the surface of the first hard coating layer 12 has a plurality of projections resulting from the particles 18. When the particles 18 are not sphere-shaped, the height of each particles 18 is greater than the thickness t of the region with the binder resin 19 only, so that the surface of the first hard coating layer 12 has a plurality of projections resulting from the particles 18. The position of respective projections of the surface of the first hard coating layer 12 is substantially identical to the position of respective particles 18. Since the positions of respective particles 18 are distributed in a random manner, the positions of respective projections of the surface of the hard coating layer 12 are distributed in a random manner. It is possible to adjust the shape and the distribution density of respective projections of the first hard coating layer 12 by changing the shape, the size, and the content of respective particles 18. The distribution density of each projection of the first hard coating layer 12 is preferably 100 pieces/mm$^2$ to 2,000 pieces/mm$^2$, more preferably 100 pieces/mm$^2$ to 1,000 pieces/mm$^2$. The distribution density of each projection of the second hard coating layer 26 is the same as the above.

The surface of the first hard coating layer 12 has an arithmetic mean roughness Ra of 0.005 µm to 0.05 µm and has a maximum height Rz is preferably 0.5 µm to 2.5 µm. This is the same as the arithmetic mean roughness Ra and the maximum height Rz of the surface of the second hard coating layer 26.

[Transparent Conductor Layer]

When there is no first index matching layer 24, the first transparent conductor layer 13 is formed on a surface of the first hard coating layer 12. When there is a first index matching layer 24, the first transparent conductor layer 13 is formed on a surface of the first index matching layer 24. The first transparent conductor layer 13 has a high transmittance (80% or higher) in a visible light region (380 nm to 780 nm) and is composed of a layer having a surface resistance value (unit: Ω per square) per unit area of 500 Ω per square or lower. The first transparent conductor layer 13 preferably has a thickness of 10 nm to 100 nm, more preferably 10 nm to 50 nm. The first transparent conductor layer 13 is typically made of any one of indium tin oxide (ITO), indium zinc-oxide or indium oxide-zinc oxide composite oxide. The second transparent conductor layer 16 is formed on a surface of the second hard coating layer 15. Properties and a material for the second transparent conductor layer 16 are the same as those for the first transparent conductor layer 13. When there is no second index matching layer 25, the second transparent conductor layer 27 is formed on a surface of the second index matching layer 27. When there is a second index matching layer 25, the second transparent conductor layer 27 is formed on a surface of the second index matching layer 25. Properties and a material for the second transparent conductor layer 27 are the same as those for the first transparent conductor layer 13.

[Metal Layer]

The first metal layer 14 is formed on a surface of the first transparent conductor layer 13. The first metal layer 14 is used to form wirings outside a touch input region when using the transparent conductive film of the present invention for a touch panel. A material for forming the first metal layer 14 is typically copper or silver and any metal excellent in conductivity except for copper and silver is used. The first metal layer 14 preferably has a thickness of 50 nm to 500 nm, more preferably 100 nm to 300 nm. The second metal layer 17 is formed on a surface of the second transparent conductor layer 16. The uses, the material, and the thickness of the second metal layer 17 is the same as those of the first metal layer 14. Further, the second metal layer 28 is formed on a surface of the transparent conductor layer 27. The uses, the material, and the thickness of the second metal layer 28 are the same as those of the first metal layer 14.

The surface of the first metal layer 14 is similar to the surface shape of the first hard coating layer 12 and has a plurality of projections 20 in a random manner. The plurality of projections 20 respectively have a distribution density of 100 pieces/mm$^2$ to 2,000 pieces/mm$^2$, more preferably 100 pieces/mm$^2$ to 1,000 pieces/mm$^2$. The surface of the first metal layer 14 preferably has an arithmetic mean roughness Ra of 0.005 µm to 0.05 µm, more preferably 0.005 µm to 0.03 µm. The surface of the first metal layer 14 preferably has a maximum height Rz of 0.5 µm to 2.5 µm, more preferably 0.5 µm to 2.0 µm. It is possible to change the arithmetic mean roughness Rz and the maximum height Rz of the surface of the first metal layer 14 by adjusting the shape, the size, and the content of respective particles 18. The surface shape of the second hard coating layer 26 is reflected in the surface of the second metal layer 28. And the surface of the second metal layer 28 has a plurality of projections 21 distributed in a random manner. The surface roughness of the second metal layer 28 is the same as the surface roughness of the first metal layer 14.

In the case where the transparent conductive film 10 of the present invention is wrapped around, the surface of the first metal layer 14 comes in contact with the surface of the second metal layer 17. There are a plurality of projections 20 distributed in a random manner on the surface and the surface of the second metal layer 17 is flat. Accordingly, the surface of the first metal layer 14 comes in point contact with the surface of the second metal layer 17. This makes it possible to prevent the first metal layer 14 and the second metal layer 17 to be bonded by pressing. In the case where the transparent conductive films 30, 40 are wrapped around, the surface of the first metal layer 14 and the surface of the second metal layer 28 comes in contact with the surface of the second metal layer 28. There are a plurality of projections 20 distributed in a random manner on the surface of the first metal layer 14. And there are a plurality of projections 21 distributed in a random manner on the surface of the second metal layer 28. Accordingly, the surface of the first metal layer 14 comes in point contact with the surface of the second metal layer 28. This enables to prevent blocking of the first metal layer 14 and the second metal layer 28. Effects for preventing blocking of the first metal layer 14 and the second metal layer 28 are greater than the effects for preventing blocking of the second metal layer 17.

[Index Matching Layer]

As shown in FIG. 3, in a transparent conductive film 40 (third embodiment) of the present invention, the first index matching layer 24 is interposed between the first hard coating layer 12 and the first transparent conductor layer 13. The second index matching layer 25 is interposed between the second hard coating layer 26 and the second transparent conductor layer 27. The first transparent conductor layer 13 is patterned in a later process and then the difference of the refractive index between a portion with the first transparent conductor layer 13 and a portion without the first transparent conductor layer 13 is minimized to prevent patterns of the first transparent conductor layer 13 from being viewed by the first index matching layer 24. Functions of the second index matching layer 25 are the same as the above.

It is preferable to set a refractive index of the first index matching layer 24 at a mean value between the refractive index of the first hard coating layer 12 and the first transparent conductor layer 13. A material for forming the first index matching layer 24 is typically urethane-based polymer. The first index matching layer 24 preferably has a thickness of 5 mm to 150 nm The thickness of the second index matching layer 25 is the same as that of the first index matching layer 24.

[Manufacturing Method]

One example of a method for manufacturing a transparent conductive film 10 (first embodiment) will now be described below. First, a hard coating agent is applied to one surface of a substrate 11 composed of a non-crystalline polymer film. The hard coating agent includes a binder resin 19 and a plurality of particles 18. Next, the hard coating agent including a binder resin 23 is applied to the other surface of the substrate 11. And then the hard coating agent is cured by the irradiation of ultraviolet rays with the hard coating agent applied to both surfaces of the substrate 11 to form a first hard coating layer 12 and a second hard coating layer 15. Subsequently, a first transparent conductor layer 13 and a first metal layer 14 are sequentially laminated on a surface of the first hard coating layer 12 by a sputtering method or the like. It is possible to sequentially laminate the first transparent conductor layer 13 and the first metal layer 14 by providing a target for a transparent conductor layer and a target for a metal layer in a sputtering apparatus. Similarly, the second transparent conductor layer 16 and the second metal layer 17 are sequentially laminated on a surface of the second hard coating layer 15.

One example of a method for manufacturing a transparent conductive film 30 (second embodiment) will now be described below. First, a hard coating agent is applied to one surface of a substrate 11 composed of a non-crystalline polymer film The hard coating agent includes a binder resin 19 and a plurality of particles 18. Next, the hard coating agent is applied to the other surface of the substrate 11. The hard coating agent includes a binder resin 23 and a plurality of particles 22. And then the hard coating agent is cured by the irradiation of ultra-violet rays with the hard coating agent applied to both surfaces of the substrate 11 to form a first hard coating layer 12 and a second hard coating layer 26. A first transparent conductor layer 13 and a first metal layer 14 are sequentially laminated on a surface of the first hard coating layer 12 by a sputtering method or the like. It is possible to sequentially laminate the first transparent conductor layer 13 and the first metal layer 14 by providing a target for a transparent conductor layer and a target for a metal layer in a sputtering apparatus. Similarly, the second transparent conductor layer 27 and the second metal layer 28 are sequentially laminated on a surface of the second hard coating layer 26.

One example of a method for manufacturing a transparent conductive film 40 (third embodiment) will now be described below. First, a hard coating agent is applied to one surface of a substrate 11 composed of a non-crystalline polymer film. The hard coating agent includes a binder resin 19 and a plurality of particles 18. Next, the hard coating agent is applied to the other surface of the substrate 11. The hard coating agent includes a binder resin 23 and a plurality of particles 22. And then the hard coating agent is cured by the irradiation of ultraviolet rays with the hard coating agent applied to both surfaces of the substrate 11 to form a first hard coating layer 12 and a second hard coating layer 15. Next, an index matching agent is applied to a surface of the first hard coating layer 12 and an index matching agent is applied to a surface of the second hard coating layer 15. Subsequently, ultraviolet rays are irradiated with the index matching agent applied onto the first hard coating layer 12 and the index matching agent applied onto the second hard coating layer 15 to cause the index matching agent to be cured to form a first index matching layer 24 and a second index matching layer 25. Next, the first transparent conductor film 13 and the first metal layer 14 are sequentially laminated on a surface of the first index matching layer 24 by a sputtering method or the like. It is possible to sequentially laminate the first transparent conductor layer 13 and the first metal layer 14 by providing a target for a transparent conductor layer and a target for a metal layer in a sputtering apparatus. Similarly, the second transparent conductor layer 27 and the second metal layer 28 are sequentially laminated on a surface of the second index matching layer 25.

EXAMPLE

A hard coating agent was applied to one surface of an elongated film substrate 11 composed of cycloolefin polymer. The hard coating agent includes a binder resin 19 and a plurality of particles 18. A hard coating agent was applied on the other surface of the elongated film substrate 11. The hard coating agent includes a binder resin 23 and a plurality of particles 22. The hard coating agent was cured by the irradiation of ultraviolet rays to form a first hard coating layer 12 and a second hard coating layer 26. The elongated film substrate 11 was "ZEONOR" (trademark) produced by ZEON CORPORATION and had a thickness of 100 μm and an in-plane birefringence of 0.0001. The plurality of particles 18, 22 were "SSX105" produced by SEKISUI JUSHI CORPORATION and were sphere-shaped with a diameter of 3 μm. Each material for the particles 18, 22 was cross linking acrylic styrene-based resin. The binder resins 19, 23 were "UNIDIC" produced by DIC CORPORATION. Each material for the binder resins 19, 23 were multifunctional poly acrylate. A surface of the first hard coating layer 12 had a plurality of projections distributed in a random manner resulting from the plurality of particles 18 and each substantially flat region between a particle 18 and another particles 18. The projections respectively had a distribution density of 205 pieces/mm$^2$. Each substantially flat region between a particle 18 and another particle 18 had a thickness t of 1 μm. The surface of the first hard coating layer 12 had an arithmetic mean roughness Ra of 0.008 μm and a maximum height Rz of 0.8 μm. The distribution density, arithmetic mean roughness Ra, and the maximum height Rz were the same as those of the first hard coating layer 12.

An elongated film substrate on which the first hard coating layer 12 and the second hard coating layer 26 were formed was put into a wind-up sputtering system to sequentially laminate an indium tin oxide layer (first transparent conductor layer 13) with a thickness of 27 nm and a copper layer (first metal layer 14) with a thickness of 200 nm on a surface of the first hard coating layer 12. The surface of the first metal layer 14 had an arithmetic mean roughness Ra of 0.02 μm and had a maximum height Rz of 1.6 μm. And then an indium tin oxide layer (second transparent conductor layer 27) with a thickness of 27 nm and a copper layer (second metal layer 28) with a thickness of 200 nm were sequentially laminated on a surface of the second hard coating layer 26. The surface of the second metal layer 28 had an arithmetic mean roughness Ra of 0.02 μm and had a maximum height Rz of 1.6 μm.

[Evaluation]

No color phase irregularity was observed because a polycycloolefin film with an extremely low birefringence was used for the substrate 11 in the aforementioned transparent conductive film 30. Further, no surface damage was incurred because of providing the first hard coating layer 12 and the second hard coating layer 26. Furthermore, even when the transparent conductive film 30 was rewound, the first metal layer 14 comes in point contact with the second metal layer 28 due to the projections 20 of the first metal layer 14 and the projections 21 of the second metal layer 28, resulting in no generation of blocking. Accordingly, the transparent conductive film 30 of the present invention can be dealt with a Roll-to-Roll process and has high productivity.

[Measuring Method]

[Birefringence]

An in-plane birefringence of the film substrate 11 was measured at a wavelength of 590 nm using a phase difference retardation meter (KOBRA-WPR produced by Oji Science Instruments Co., Ltd.).

[Surface Roughness]

Surface roughness Ra, Rz was measured using an optical profilometer (Optical Profilometer NT3300 produced by Veeco Instruments Ltd.).

[Film Thickness]

The cross-section of an indium tin oxide layer was observed by using a transmission electron microscope (H-7650 produced by Hitachi. Ltd.). The thickness of the substrate 11 was measured using a film meter (Digital dial Gauge DG-205 manufactured by Ozaki Mfg. Co., Ltd).

Industrial Applicability

Although the application of the transparent conductive film of the present invention is not limited, the transparent conductive film of the present invention can be favorably used in a capacitance-type touch panel, especially in a capacitance-type touch panel which is of projection type.

This application claims priority from Japanese Patent Application No. 2011-255764, which is incorporated herein by reference.

There has thus been shown and described a novel transparent conductive film which fulfills all the objects and advantages sought therefor. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

What is claimed is:

1. A transparent conductive film, comprising:
    a substrate composed of a non-crystalline polymer film; a first hard coating layer;
    a first transparent conductor layer;
    a first metal layer, the first hard coating layer, the first transparent conductor layer, and the first metal layer being sequentially formed on one surface of the substrate;
    a second hard coating layer;
    a second transparent conductor layer; and
    a second metal layer, the second hard coating layer, the second transparent conductor layer, and the second metal layer being sequentially formed on the other surface of the substrate,
    the first hard coating layer includes a binder resin and a plurality of sphere-shaped particles having a diameter of 1 μm to 5 μm,
    a diameter of each of the plurality of particles is greater than a thickness of a flat region in the binder resin, and
    the first metal layer has a plurality of projections having a maximum height Rz of 0.5 μm to 2.5 μm resulting from the plurality of particles included in the first hard coating layer.

2. The transparent conductive film according to claim 1, wherein the first metal layer has a distribution density of 100 pieces/mm$^2$ to 2,000 pieces/mm$^2$ in the plurality of projections formed on a surface thereof.

3. The transparent conductive film according to claim 1, wherein the second hard coating layer includes a binder resin and a plurality of particles, a diameter and a thickness of a plurality of particles included in the second hard coating layer are respectively greater than a thickness of a flat region in the binder resin included in the second hard coating layer, and the second metal layer has a plurality of projections resulting from the plurality of particles included in the second hard coating layer.

4. The transparent conductive film according to claim 3, wherein the second metal layer has a distribution density of 100 pieces/mm$^2$ to 2,000 pieces/mm$^2$ in a plurality of projections formed on a surface thereof.

5. The transparent conductive film according to claim 3, wherein the plurality of particles included in the second hard coating layer are sphere-shaped and respectively have a diameter of 1 μm to 5 μm.

6. The transparent conductive film according to claim 1, wherein the plurality of particles included in the first hard coating layer respectively have a content of 0.05% by weight to 3% by weight of the first hard coating layer.

7. The transparent conductive film according to claim 3, wherein the plurality of particles included in the second hard coating layer respectively have a content of 0.05% by weight to 3% by weight of the second hard coating layer.

8. The transparent conductive film according to claim 1, wherein a material for forming the non-crystalline polymer film is polycycloolefin or polycarbonate.

9. The transparent conductive film according to claim 8, wherein the non-crystalline polymer film has an in-plane birefringence of 0 to 0.001 and the in-plane birefringence has irregularity of 0.0005 or lower.

10. The transparent conductive film according to claim 1, wherein the first metal layer has an arithmetic mean roughness Ra of 0.005 μm to 0.05 μm on a surface thereof.

11. The transparent conductive film according to claim 1, wherein a material for forming the plurality of particles included in the first hard coating layer is acrylic polymer, silicone polymer, styrene polymer or inorganic silica.

12. The transparent conductive film according to claim 3, wherein the second metal layer has an arithmetic mean roughness Ra of 0.005 μm to 0.05 μm on a surface thereof and has a maximum height Rz of 0.5 μm to 2.5 μm.

13. The transparent conductive film according to claim 3, wherein a material for forming the plurality of particles included in the second hard coating layer is acrylic polymer, silicone polymer, styrene polymer or inorganic silica.

14. The transparent conductive film according to claim 1, wherein each material for forming the first transparent conductor layer and the second transparent conductor layer is any one of indium tin oxide (ITO), indium zinc oxide or indium oxide-zinc composite oxide.

15. The transparent conductive film according to claim 1, wherein each material for forming the first metal layer and the second metal layer is copper or silver.

\* \* \* \* \*